(12) United States Patent
Park et al.

(10) Patent No.: US 9,601,445 B2
(45) Date of Patent: Mar. 21, 2017

(54) SEMICONDUCTOR PACKAGES

(71) Applicant: Samsung Electronics Co., Ltd., Suwon-si, Gyeonggi-do (KR)

(72) Inventors: Ji-Yong Park, Hwaseong-si (KR); Woonbae Kim, Seoul (KR); Kyoungsei Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/855,572

(22) Filed: Sep. 16, 2015

(65) Prior Publication Data

US 2016/0148881 A1   May 26, 2016

(30) Foreign Application Priority Data

Nov. 26, 2014 (KR) .......................... 10-2014-0166542

(51) Int. Cl.
| | |
|---|---|
| *H01L 23/552* | (2006.01) |
| *H01L 23/60* | (2006.01) |
| *H01L 23/498* | (2006.01) |
| *H01L 23/14* | (2006.01) |
| *H01L 23/00* | (2006.01) |

(52) U.S. Cl.
CPC .......... *H01L 23/60* (2013.01); *H01L 23/145* (2013.01); *H01L 23/49827* (2013.01); *H01L 23/49838* (2013.01); *H01L 23/49866* (2013.01); *H01L 23/49894* (2013.01); *H01L 23/552* (2013.01); *H01L 24/00* (2013.01)

(58) Field of Classification Search
CPC .............. H01L 23/60; H01L 23/49866; H01L 23/49838; H01L 23/49827
See application file for complete search history.

(56) References Cited

U.S. PATENT DOCUMENTS

| | | | |
|---|---|---|---|
| 7,772,777 | B2 | 8/2010 | Baik et al. |
| 7,994,871 | B2 | 8/2011 | Chen et al. |
| 8,269,322 | B2 | 9/2012 | Kim |
| 8,319,318 | B2 | 11/2012 | Nalla et al. |
| 2007/0013056 | A1* | 1/2007 | Lee ..................... H01L 23/3677 257/723 |
| 2013/0207005 | A1 | 8/2013 | Cheng et al. |

FOREIGN PATENT DOCUMENTS

| | | |
|---|---|---|
| JP | 11-271795 | 10/1999 |
| JP | 5354589 | 11/2013 |
| KR | 10-0416144 | 1/2004 |
| KR | 10-2007-0069639 | 7/2007 |
| KR | 10-2010-0129619 | 12/2010 |
| KR | 10-2013-0132450 | 12/2013 |
| KR | 10-1337979 | 12/2013 |
| KR | 10-1409094 | 6/2014 |

* cited by examiner

*Primary Examiner* — Elias M Ullah
(74) *Attorney, Agent, or Firm* — Myers Bigel, P.A.

(57) ABSTRACT

Semiconductor packages are provided. The semiconductor packages may include a base film having a top surface and a bottom surface, a circuit pattern disposed on the top surface of the base film and connected to a ground terminal, a via hole penetrating the base film, a lower shielding layer that is electrically connected to the circuit pattern and fills the whole region of the via hole and cover the bottom surface of the base.

19 Claims, 18 Drawing Sheets

SEMICONDUCTOR PACKAGES

CROSS-REFERENCE TO RELATED APPLICATIONS

This U.S. non-provisional patent application claims priority under 35 U.S.C. §119 to Korean Patent Application No. 10-2014-0166542, filed on Nov. 26, 2014, in the Korean Intellectual Property Office, the entire contents of which are hereby incorporated by reference.

BACKGROUND OF THE INVENTION

Example embodiments of the inventive concepts relate to a semiconductor package, and in particular, to a chip-on-film (COF) package.

Due to their small-size, multifunctionality, and/or low-cost characteristics, semiconductor devices are considered important elements in the electronic industry. The semiconductor devices can be generally classified into a memory device for storing data, a logic device for processing data, and a hybrid device capable of performing various functions.

Higher integration and higher speed of semiconductor devices is required to satisfy consumer demands for electronic devices with a high density and a fast speed. A variety of studies are being conducted to meet such demands, i.e., to increase the integration density and performance of the semiconductor device.

SUMMARY

Example embodiments of the inventive concepts provide a semiconductor package with a high density and a high speed.

According to example embodiments of the inventive concepts, a semiconductor package may include a base film with a top surface and a bottom surface, a circuit pattern disposed on the top surface of the base film and connected to a ground terminal, a via hole penetrating the base film, a lower shielding layer electrically connected to the circuit pattern to fill the whole region of the via hole and cover the bottom surface of the base film.

In example embodiments, the lower shielding layer may be provided to wholly cover the bottom surface of the base film.

In example embodiments, the semiconductor package may further include an upper protection layer on the circuit pattern to protect the circuit pattern, and a lower protection layer on the lower shielding layer to protect the lower shielding layer.

In example embodiments, the lower shielding layer may include at least one of a conductive paste or a conductive adhesive.

In example embodiments, the lower shielding layer may include a first lower layer filling the via hole and extending onto the bottom surface of the base film, and a second lower layer on the first lower layer to cover the first lower layer.

In example embodiments, the first lower layer may include one of a conductive paste and a conductive adhesive, and the second lower layer may include the same material as that contained in the circuit pattern.

In example embodiments, the second lower layer may be a metal layer including at least one of copper (Cu), silver (Ag), gold (Au), nickel (Ni), tin (Sn), zinc (Zn), chromium (Cr), manganese (Mn), indium (Id), palladium (Pd), titanium (Ti), molybdenum (Mo), or platinum (Pt).

In example embodiments, the semiconductor package may further include a semiconductor chip on the top surface of the base film.

In example embodiments, the semiconductor package may further include an upper shielding layer provided on the top surface of the base film and electrically connected to the circuit pattern.

In example embodiments, the upper shielding layer may include the same material as that contained in the lower shielding layer.

In example embodiments, the semiconductor package may further include an additional protection layer on the upper shielding layer to protect the upper shielding layer.

In example embodiments, the upper shielding layer may include a first upper layer electrically connected to the circuit pattern, and a second upper layer on the first upper layer to cover the first upper layer.

In example embodiments, the upper shielding layer may be provided to expose the semiconductor chip.

In example embodiments, the upper shielding layer may be provided to cover the semiconductor chip.

According to example embodiments of the inventive concepts, a semiconductor package may include a base film with a via hole, a lower shielding layer electrically connected to a ground terminal to fill the via hole and cover a bottom surface of the base film, and an upper shielding layer electrically connected to the lower shielding layer to cover a top surface of the base film.

In example embodiments, the semiconductor package may further include a circuit pattern disposed between the top surface of the base film and the upper shielding layer and electrically connected to the ground terminal, and an upper protection layer between the circuit pattern and the upper shielding layer, the upper protection layer having an opening, which may be in contact with the circuit pattern and the upper shielding layer.

In example embodiments, the semiconductor package may further include a semiconductor chip on the top surface of the base film and spaced apart from the upper shielding layer.

In example embodiments, the semiconductor package may further include a semiconductor chip disposed between the top surface of the base film and the upper shielding layer.

In example embodiments, the lower shielding layer may include a first lower layer including a conductive paste and a conductive adhesive, and a second lower layer including copper (Cu), silver (Ag), gold (Au), nickel (Ni), tin (Sn), zinc (Zn), chromium (Cr), manganese (Mn), indium (Id), palladium (Pd), titanium (Ti), molybdenum (Mo), or platinum (Pt).

In example embodiments, the upper shielding layer may include a first upper layer including a conductive paste and a conductive adhesive, and a second upper layer including copper (Cu), silver (Ag), gold (Au), nickel (Ni), tin (Sn), zinc (Zn), chromium (Cr), manganese (Mn), indium (Id), palladium (Pd), titanium (Ti), molybdenum (Mo), or platinum (Pt).

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
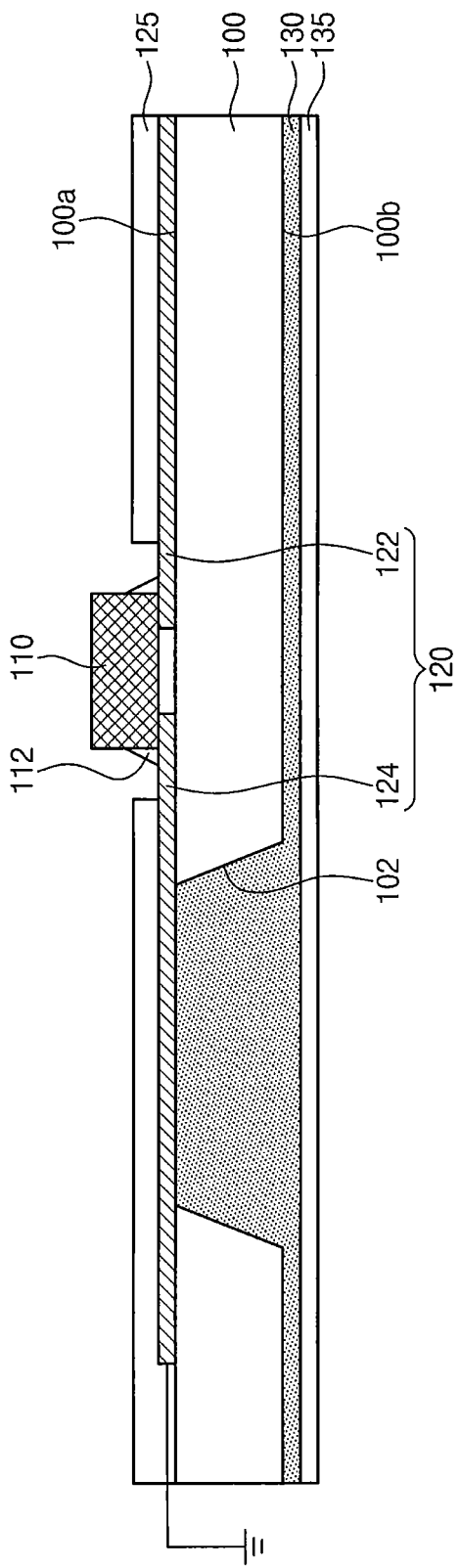
FIG. 1A is a sectional view illustrating a semiconductor package according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, steps, operations, elements and/or components, but do not preclude the presence or addition of one or more other features, steps, operations, elements, components and/or groups thereof.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
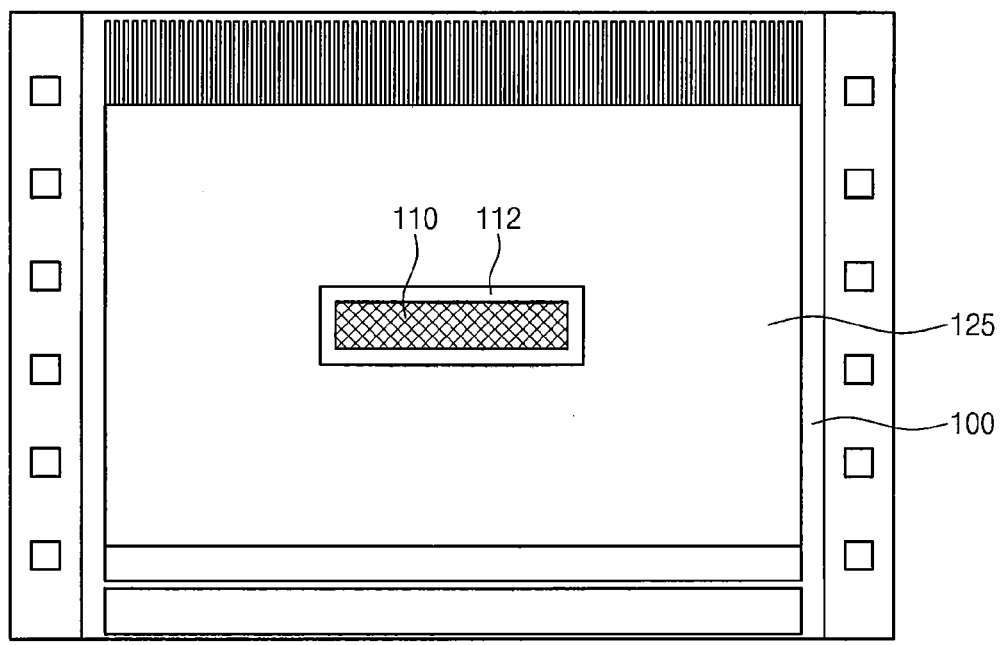
FIGS. 1B and 1C are plan views illustrating top and bottom surfaces of the semiconductor package of FIG. 1A.
Figure 1C:
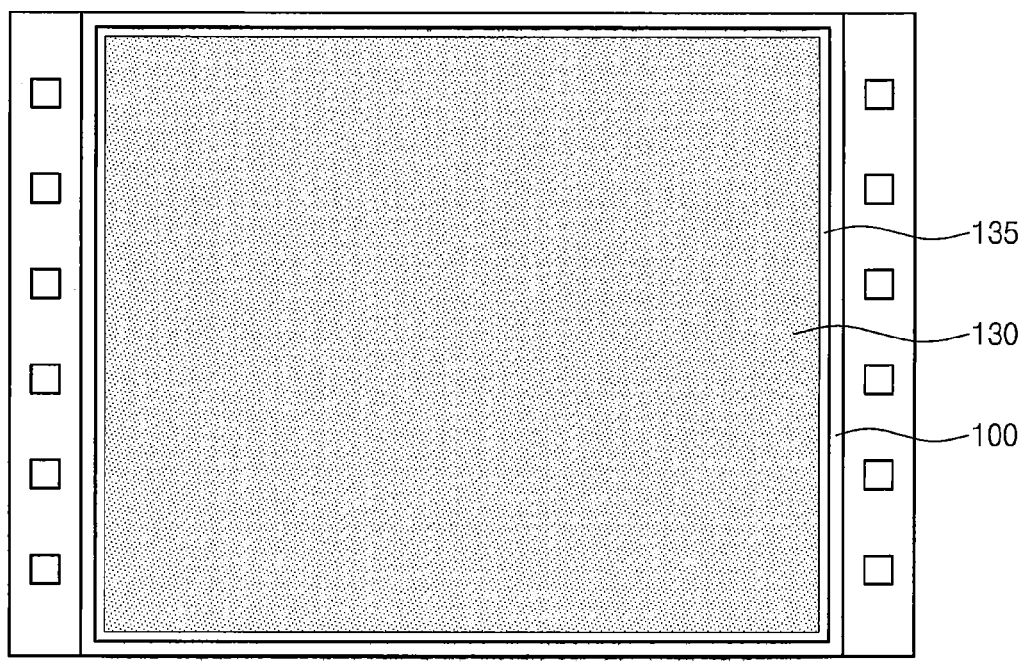
Figure 2A:
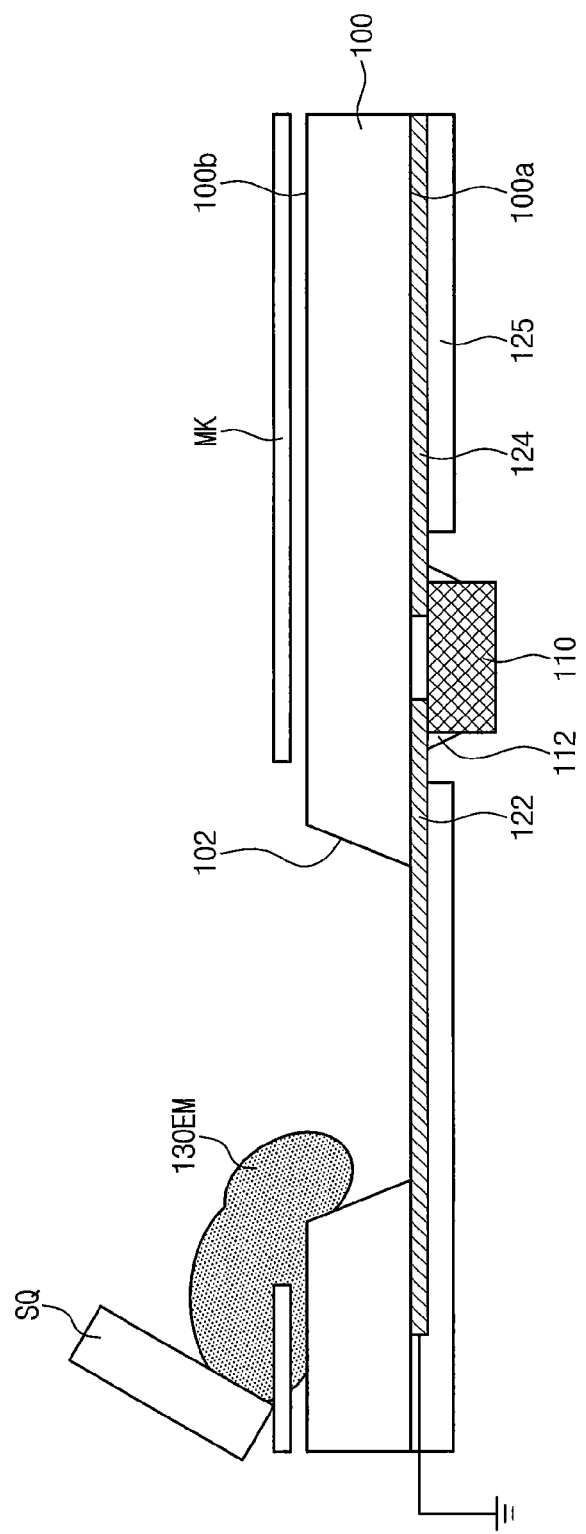
FIGS. 2A and 2B are sectional views illustrating a method of fabricating a semiconductor package according to example embodiments of the inventive concepts.
Figure 2B:
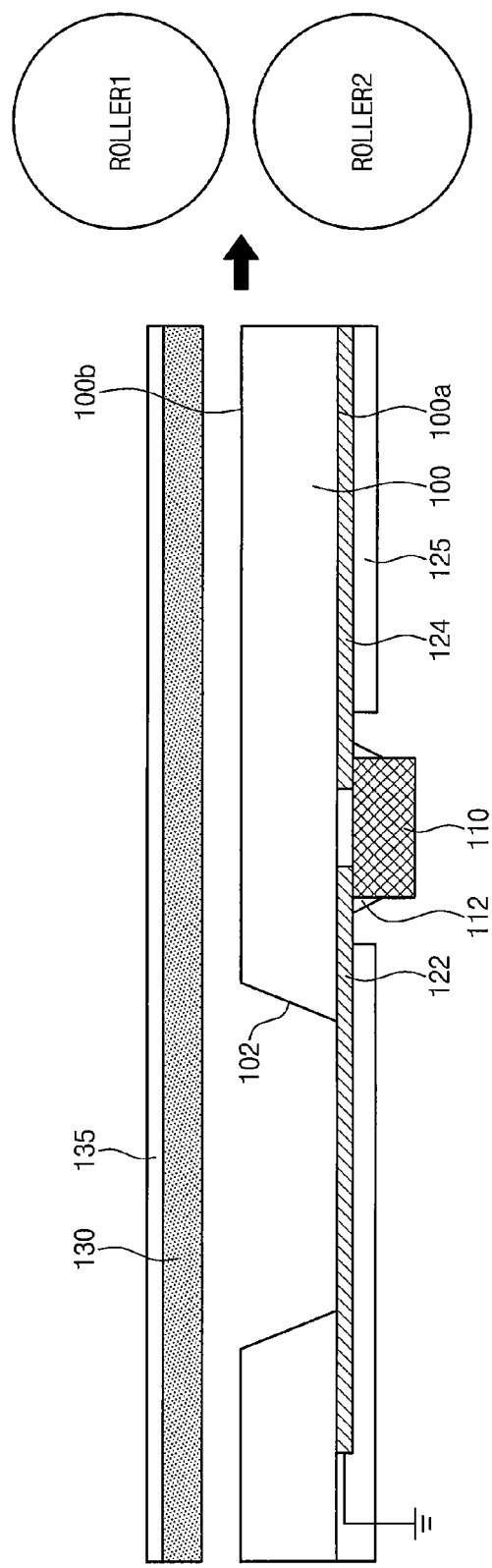

FIG. 1A is a sectional view illustrating a semiconductor package according to example embodiments of the inventive concepts. FIGS. 1B and 1C are plan views illustrating top and bottom surfaces of the semiconductor package of FIG. 1A. FIGS. 2A and 2B are sectional views illustrating a method of fabricating a semiconductor package according to example embodiments of the inventive concepts.

Referring to FIGS. 1A through 1C, a semiconductor package may include a base film 100, a semiconductor chip 110, circuit patterns 120, a lower shielding layer 130, an upper protection layer 125, and a lower protection layer 135.

The base film 100 may be an insulating film containing a resin, such as polyimide (PI), polyamide (AD), polyethylene terephthalate (PET), polyethylene naphthalate (PEN), polyethersulphone (PES), polyacrylate (PAR), polyetherimide (PEI), polyphenylene sulfide (PPS), polyallylate, polycarbonate (PC), cellulose triacetate (TAC), or cellulose acetate propionate (CAP).

The base film 100 may have a top surface 100a and a bottom surface 100b. The semiconductor chip 110 may be provided on a center region of the top surface 100a of the base film 100. In example embodiments, the semiconductor chip 110 may have a flip-chip structure. A connecting portion (not shown) connecting the semiconductor chip 110 with the base film 100 may be protected by an under-fill layer 112. Alternatively, the connecting portion may be protected by a molding structure.

The circuit patterns 120 may be provided on the top surface 100a of the base film 100. The circuit patterns 120 may include a first circuit pattern 122 applying a driving signal to the semiconductor chip 110 and a second circuit pattern 124 connected to a ground terminal. The circuit patterns 120 may include metals, such as copper (Cu), silver (Ag), gold (Au), nickel (Ni), tin (Sn), zinc (Zn), chromium (Cr), manganese (Mn), indium (Id), palladium (Pd), titanium (Ti), molybdenum (Mo), or platinum (Pt).

The upper protection layer 125 may be provided on the top surface 100a of the base film 100 to cover the circuit patterns 120. The upper protection layer 125 may include an insulating material. The upper protection layer 125 may be formed to expose the semiconductor chip 110 and cover the top surface 100a of the base film 100.

The base film 100 may include a via hole 102 penetrating the base film 100. The via hole 102 may be formed to expose a portion of the second circuit pattern 124.

The lower shielding layer 130 may be formed to fill the whole region of the via hole 102 and may be extended to cover the bottom surface 100b of the base film 100. The lower shielding layer 130 may be electrically connected to the second circuit pattern 124, thereby having a ground potential.

In example embodiments, the lower shielding layer 130 may include a conductive paste. The conductive paste may contain polymer solution and metal powder mixed therein. The metal powder in the conductive paste may be formed of or include copper (Cu), silver (Ag), gold (Au), nickel (Ni), tin (Sn), zinc (Zn), chromium (Cr), manganese (Mn), indium (Id), palladium (Pd), titanium (Ti), molybdenum (Mo), or platinum (Pt). In this case, as shown in FIG. 2A, the lower shielding layer 130 may be formed by a screen printing process. To put it briefly, a mask MK may be disposed spaced apart from the bottom surface 100b of the base film 100 with the via hole 102 to face the bottom surface 100b of the base film 100. On the mask MK, conductive paste emulsion 130EM may be provided to fill a region between the bottom surface 100b of the base film 100 and the mask MK and in the via hole 102, and here, the filling of the conductive paste emulsion 130EM may be performed using, for example, a squeezer SQ. As a result, the lower shielding layer 130 containing the conductive paste may be formed on the bottom surface 100b of the base film 100 and in the via hole 102.

In some example embodiments, the lower shielding layer 130 may include a conductive adhesive. The conductive adhesive may contain a resin and conductive particles mixed therein. The conductive particles contained in the conductive adhesive may be formed of or include a metallic material (e.g., copper (Cu), silver (Ag), gold (Au), nickel (Ni), tin (Sn), zinc (Zn), chromium (Cr), manganese (Mn), indium (Id), palladium (Pd), titanium (Ti), molybdenum (Mo), and platinum (Pt)) or an organic metal compound thereof. As an example, the conductive adhesive may include an anisotropic conductive adhesive. In this case, as shown in FIG. 2B, the lower shielding layer 130 may be formed using first and second rollers ROLLER 1 and ROLLER 2. To put it briefly, a stack of the conductive adhesive and the upper protection layer 125 may be disposed on the bottom surface 100b of the base film 100 with the via hole 102. Thereafter, the structure and the base film 100 may pass through a gap between the first and second rollers ROLLER 1 and ROLLER 2, and thus, the lower shielding layer 130 containing the conductive adhesive may be formed. The first roller ROLLER 1 may heat the structure and the base film 100, and the second roller ROLLER 2 may exert a pressure on the structure and the base film 100.

In example embodiments, the lower shielding layer 130 may be provided to cover the entire bottom surface 100b of the base film 100.

The lower protection layer 135 may be provided on the bottom surface 100b of the base film 100 to cover the lower shielding layer 130. The lower protection layer 135 may include an insulating material.

Figure 3A:
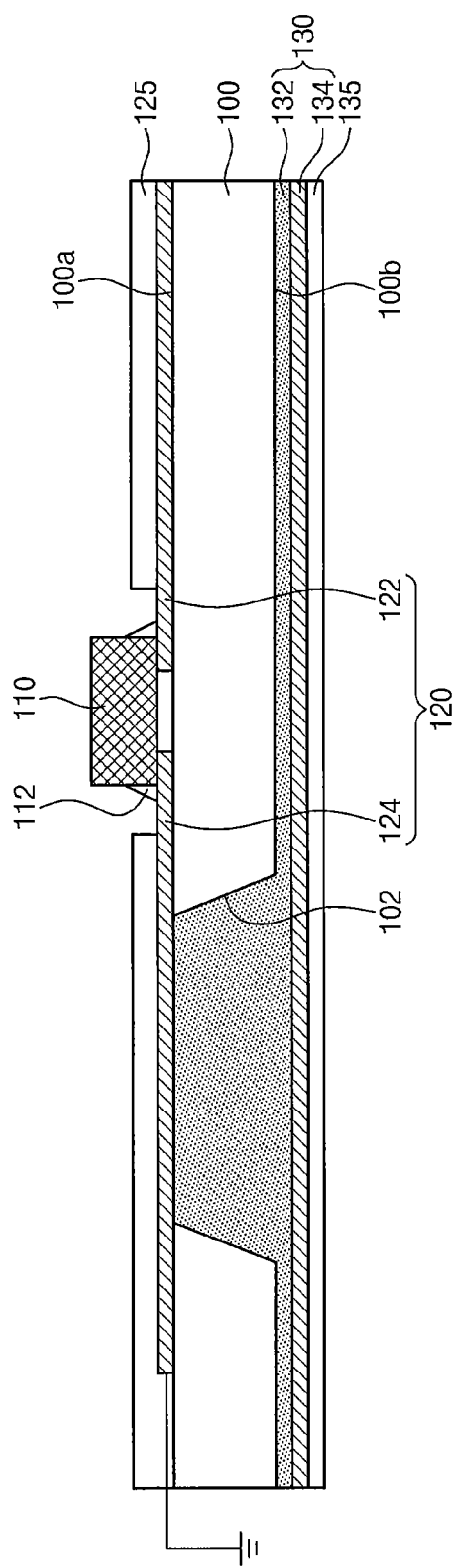
FIG. 3A is a sectional view illustrating a semiconductor package according to example embodiments of the inventive concepts.
Figure 3B:
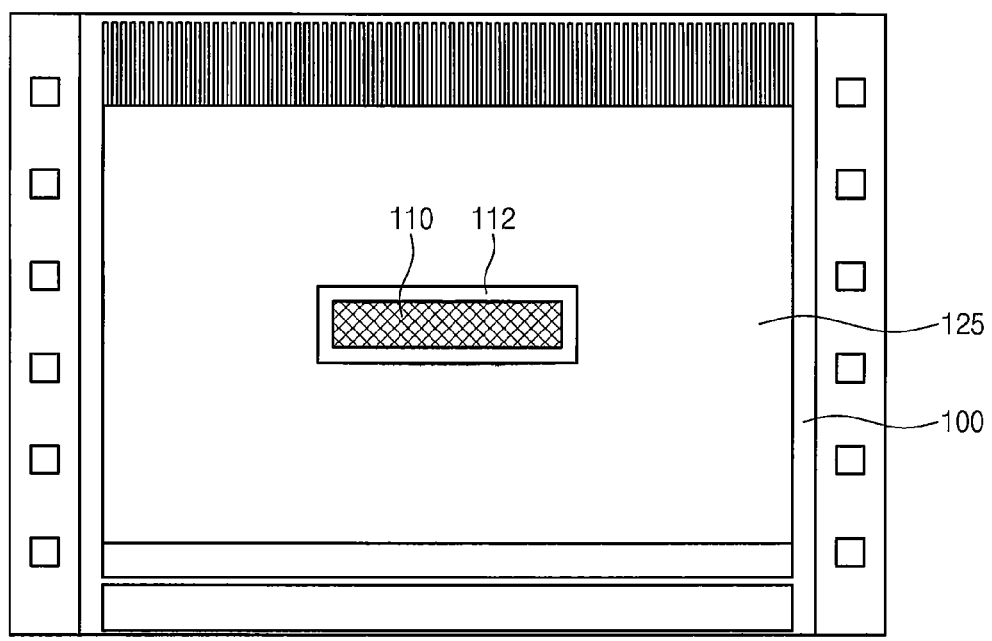
FIGS. 3B and 3C are plan views illustrating top and bottom surfaces of the semiconductor package of FIG. 3A.
Figure 3C:
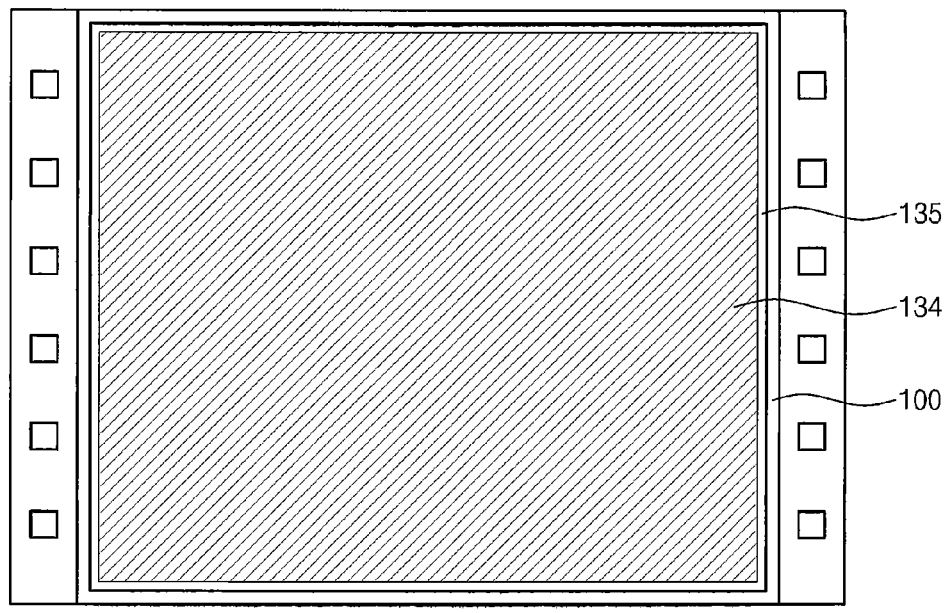

FIG. 3A is a sectional view illustrating a semiconductor package according to some example embodiments of the inventive concepts. FIGS. 3B and 3C are plan views illustrating top and bottom surfaces of the semiconductor package of FIG. 3A.

Referring to FIGS. 3A through 3C, a semiconductor package may include a base film 100, a semiconductor chip 110, circuit patterns 120, a lower shielding layer 130, an upper protection layer 125, and a lower protection layer 135.

The lower shielding layer 130 may have a multi-layered structure. In example embodiments, the lower shielding layer 130 may include a first lower layer 132, which is formed to fill a via hole 102 penetrating the base film 100 and cover the bottom surface 100b of the base film 100, and a second lower layer 134 covering the first lower layer 132. The first lower layer 132 may be in contact with a second circuit pattern 124 of the circuit patterns 120 and may be electrically connected to a ground terminal via the via hole 102.

The first lower layer 132 may include a conductive paste or a conductive adhesive. The second lower layer 134 may be formed of or include a metallic material, such as copper (Cu), silver (Ag), gold (Au), nickel (Ni), tin (Sn), zinc (Zn), chromium (Cr), manganese (Mn), indium (Id), palladium (Pd), titanium (Ti), molybdenum (Mo), and platinum (Pt).

In the semiconductor packages of FIGS. 3A through 3C, the base film 100, the semiconductor chip 110, the circuit patterns 120, the lower shielding layer 130, the upper protection layer 125, and the lower protection layer 135 may have substantially the same features as those of the previous embodiments described with reference to FIGS. 1A, 1B, and 1C, and thus, detailed description thereof is omitted.

Figure 4A:
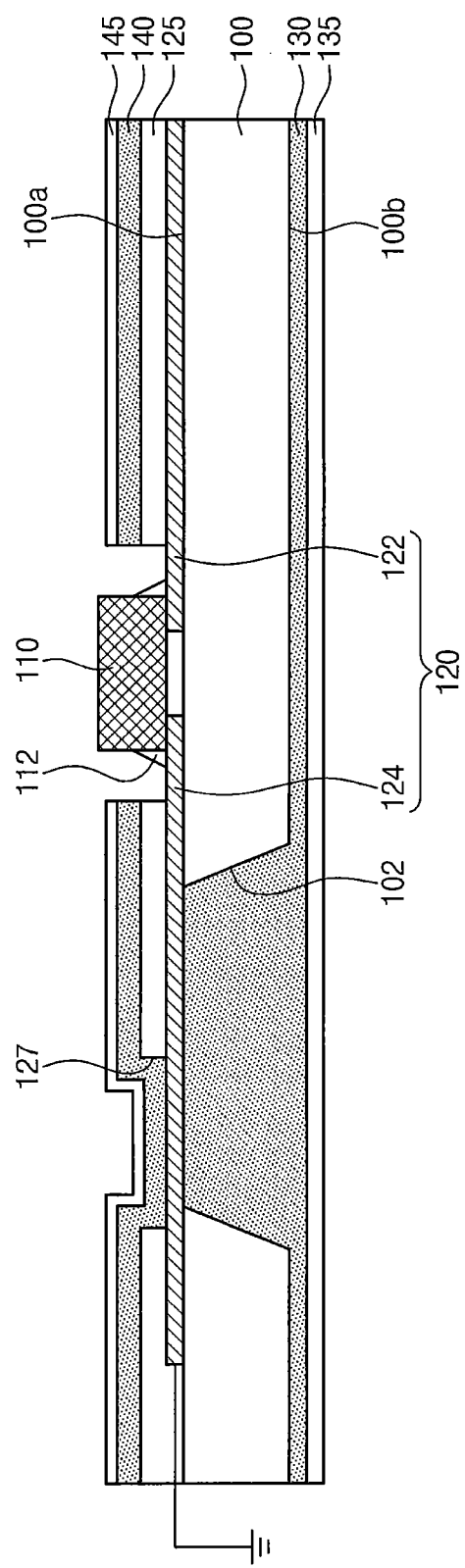
FIG. 4A is a sectional view illustrating a semiconductor package according to example embodiments of the inventive concepts.
Figure 4B:
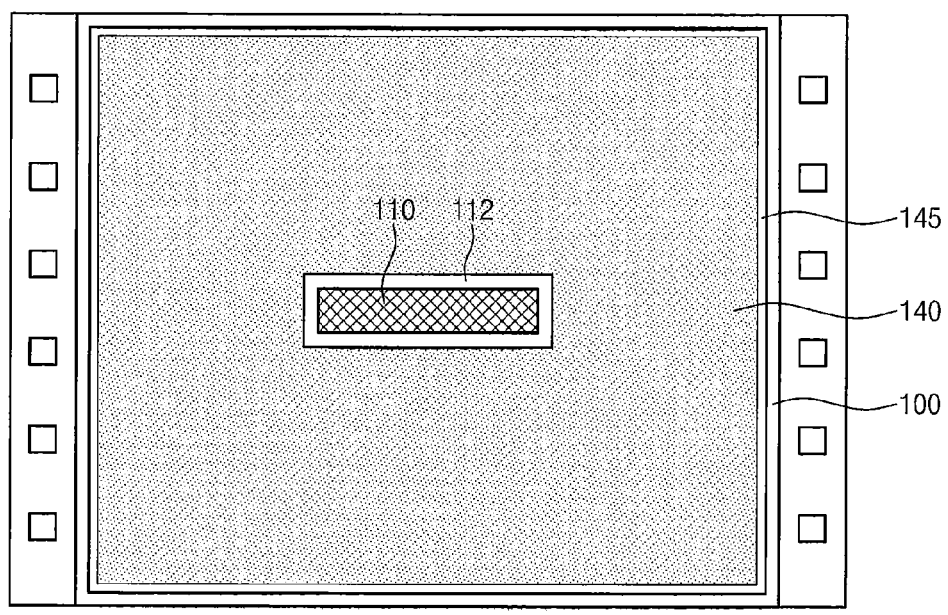
FIGS. 4B and 4C are plan views illustrating top and bottom surfaces of the semiconductor package of FIG. 4A.
Figure 4C:
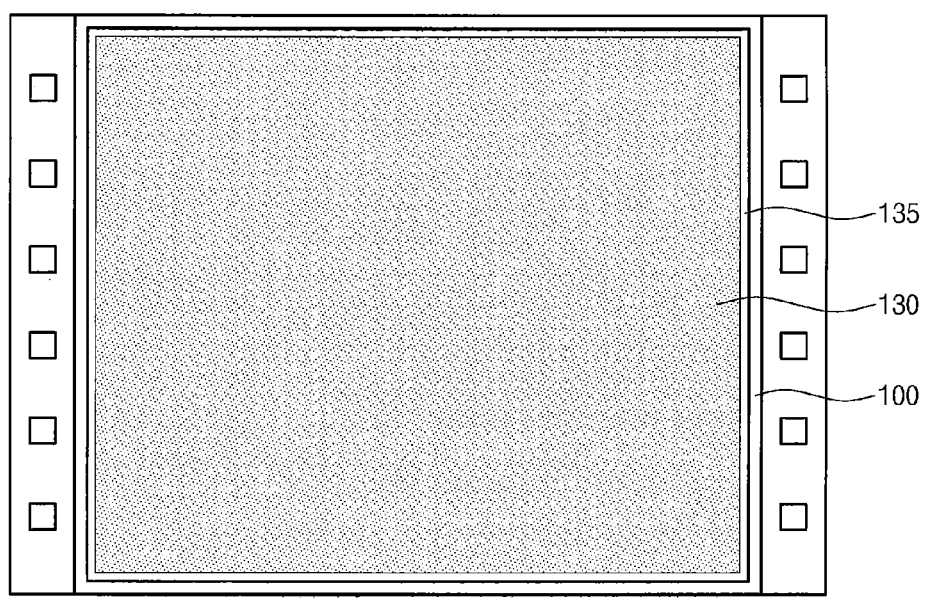
Figure 5A:
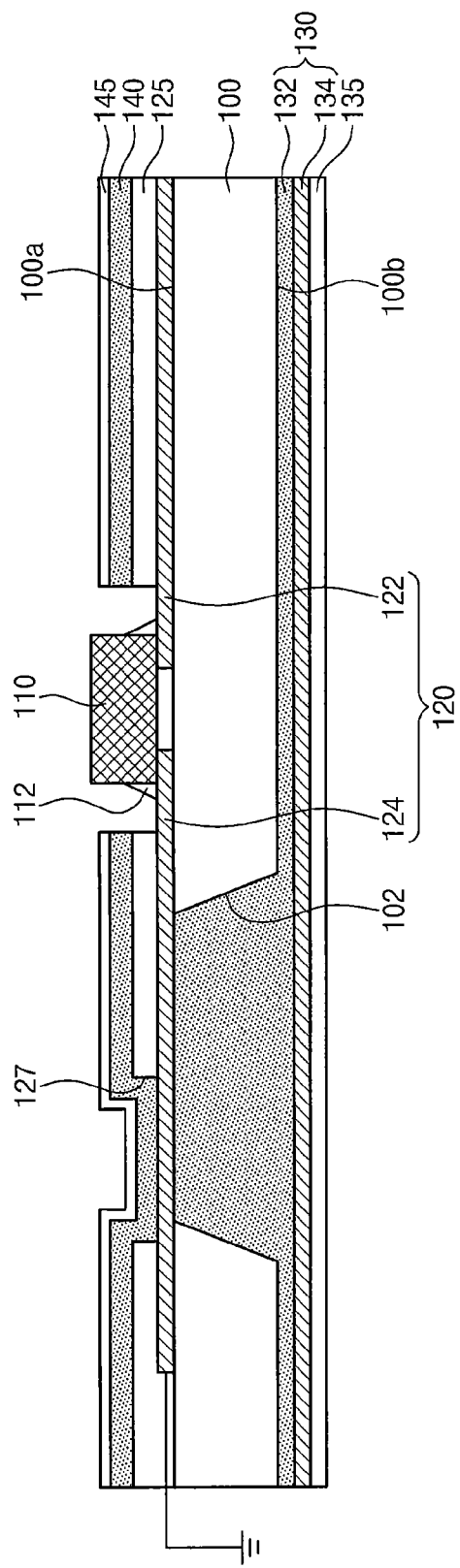
FIGS. 5A through 5C are sectional views illustrating semiconductor packages according to example embodiments of the inventive concepts.
Figure 5B:
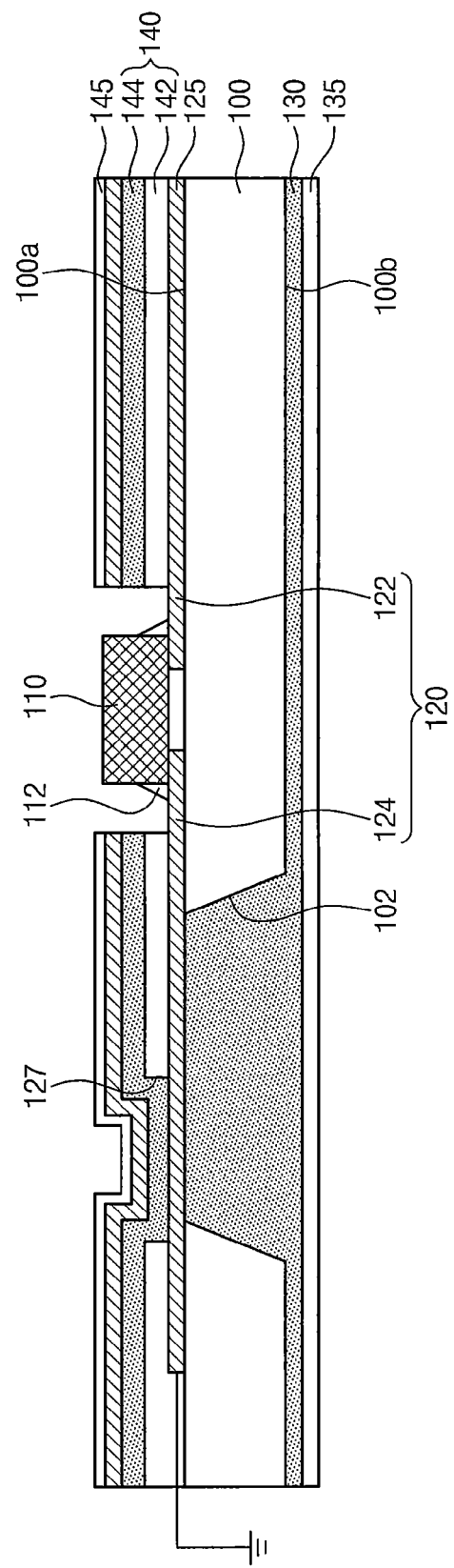
Figure 5C:
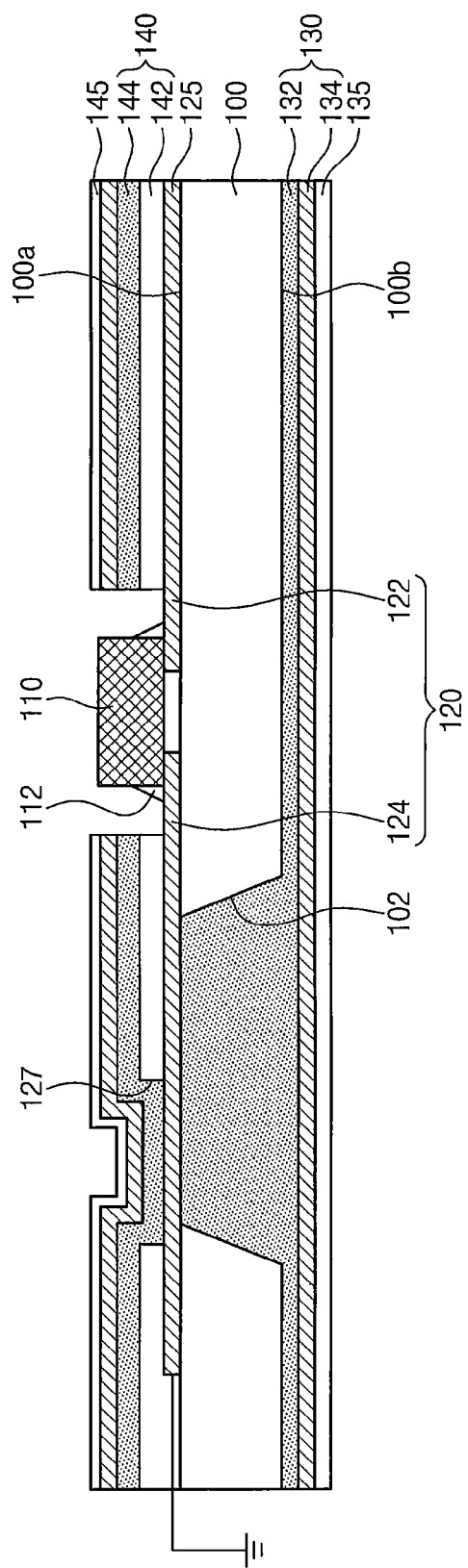

FIG. 4A is a sectional view illustrating a semiconductor package according to example embodiments of the inventive concepts. FIGS. 4B and 4C are plan views illustrating top and bottom surfaces of the semiconductor package of FIG. 4A. FIGS. 5A through 5C are sectional views illustrating semiconductor packages according to example embodiments of the inventive concepts.

Referring to FIGS. 4A through 4C and 5A through 5C, a semiconductor package may include a base film 100, a semiconductor chip 110, circuit patterns 120, a lower shielding layer 130, an upper shielding layer 140, an upper protection layer 125, a lower protection layer 135, and an additional protection layer 145.

The lower shielding layer 130 may be substantially the same as the lower shielding layer 130 described with reference to FIGS. 1A through 1C.

The upper shielding layer 140 may be provided on the top surface 100a of the base film 100. In example embodiments, the upper protection layer 125 covering the circuit patterns 120 may be partially etched by an etching process to expose the second circuit pattern 124 electrically connected to the ground terminal, and the upper shielding layer 140 may be provided on the upper protection layer 125 to be in contact with the exposed portion of the second circuit pattern 124. In example embodiments, the upper shielding layer 140 may be provided to cover the entire region of the top surface 100a of the base film 100, except for a region on which the semiconductor chip 110 is provided. In some embodiments, the upper shielding layer 140 may include one of a conductive paste and a conductive adhesive.

On the upper shielding layer 140, the additional protection layer 145 may be provided to protect the upper shielding layer 140. As an example, the additional protection layer 145 may be formed to wholly cover the upper shielding layer 140. The additional protection layer 145 may be formed of or include an insulating material.

Referring to FIG. 5A, the lower shielding layer 130 may have a multi-layered structure. In example embodiments, the lower shielding layer 130 may include a first lower layer 132, which is formed to fill a via hole 102 penetrating the base film 100 and cover the bottom surface 100b of the base film 100, and a second lower layer 134 covering the first lower layer 132. The first lower layer 132 may be in contact with a second circuit pattern 124 of the circuit patterns 120 and may be electrically connected to a ground terminal via the via hole 102. The lower shielding layer 130 may be substantially the same as that described with reference to FIGS. 3A through 3C.

Referring to FIG. 5B, the upper shielding layer 140 may have a multi-layered structure. In example embodiments, the upper shielding layer 140 may include a first upper layer 142, which is in contact with a portion of the second circuit pattern 124 exposed by partially etching the upper protection layer 125, and a second upper layer 144 covering the first upper layer 142. The first upper layer 142 may include a conductive paste or a conductive adhesive. The second upper layer 144 may be formed of or include a metallic material, such as copper (Cu), silver (Ag), gold (Au), nickel (Ni), tin (Sn), zinc (Zn), chromium (Cr), manganese (Mn), indium (Id), palladium (Pd), titanium (Ti), molybdenum (Mo), and platinum (Pt).

Referring to FIG. 5C, the lower and upper shielding layers 130 and 140 may have a multi-layered structure. Each of the lower and upper shielding layers 140 may have the multi-layered structure described with reference to FIGS. 5A and 5B.

In the semiconductor packages of FIGS. 4A through 4C and FIGS. 5A through 5C, the base film 100, the semiconductor chip 110, the circuit patterns 120, the lower shielding layer 130, the upper protection layer 125, and the lower protection layer 135 may have substantially the same features as those of the previous embodiments described with reference to FIGS. 1A, 1B, and 1C, and thus, detailed description thereof is omitted.

Figure 6A:
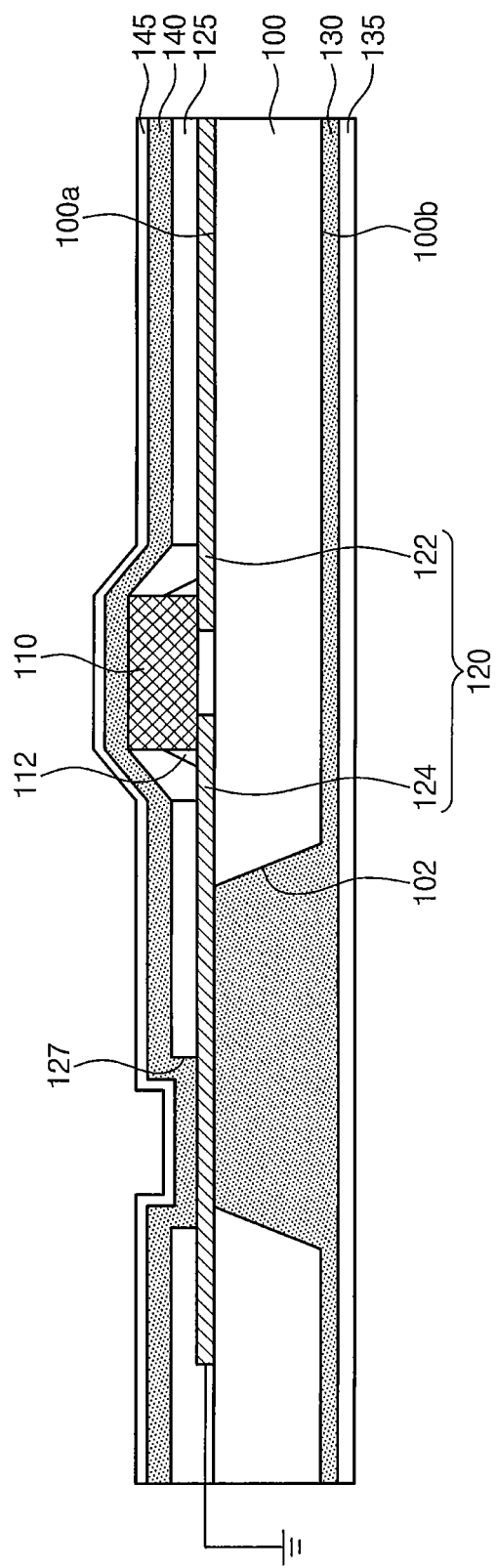
FIG. 6A is a sectional view illustrating a semiconductor package according to example embodiments of the inventive concepts.
Figure 6B:
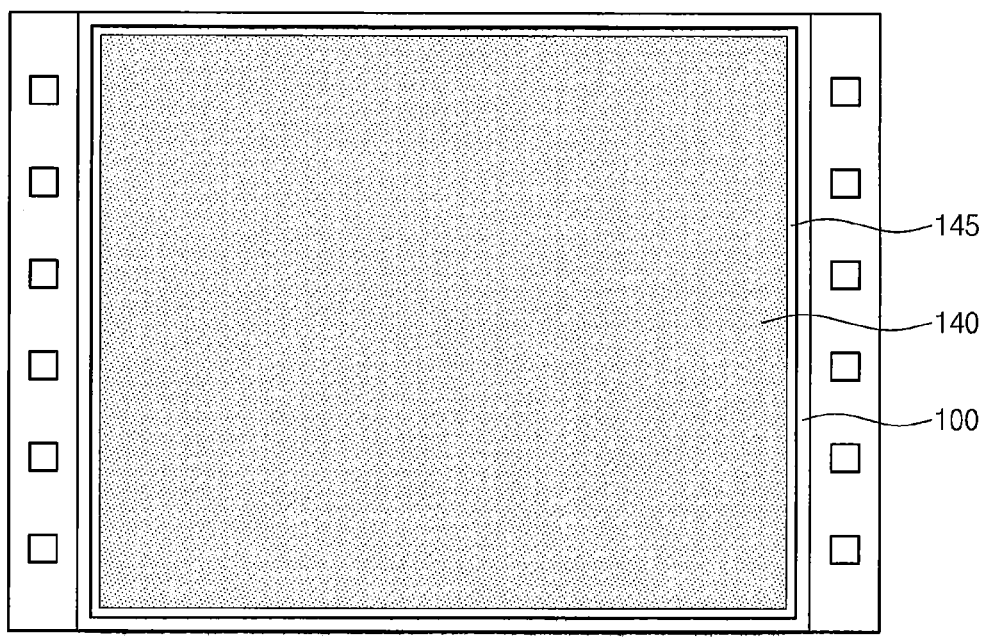
FIGS. 6B and 6C are plan views illustrating top and bottom surfaces of the semiconductor package of FIG. 6A.
Figure 6C:
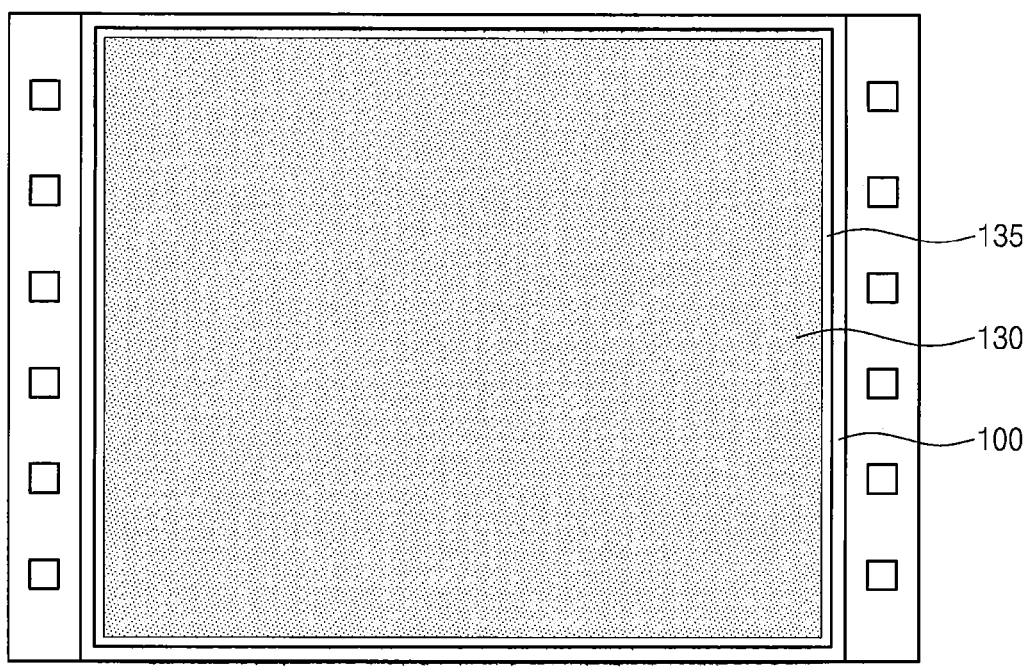

FIG. 6A is a sectional view illustrating a semiconductor package according to example embodiments of the inventive concepts. FIGS. 6B and 6C are plan views illustrating top and bottom surfaces of the semiconductor package of FIG. 6A.

Referring to FIGS. 6A through 6C, a semiconductor package may include a base film 100, a semiconductor chip 110, circuit patterns 120, a lower shielding layer 130, an upper shielding layer 140, an upper protection layer 125, a lower protection layer 135, and an additional protection layer 145.

The lower shielding layer 130 may be substantially the same as the lower shielding layer 130 described with reference to FIGS. 1A through 1C.

The upper shielding layer 140 may be provided on a top surface of the base film 100. In example embodiments, the upper protection layer 125 covering the circuit patterns 120 may be partially etched to expose a portion of the second circuit pattern 124 electrically connected to the ground terminal. The exposed portion of the second circuit pattern 124 may be electrically connected to the upper shielding layer 140. In example embodiments, the upper shielding layer 140 may be formed to cover the whole top surface of the semiconductor chip 110. In this case, the semiconductor chip 110 may be protected by a molding element (not shown), and thus, the upper shielding layer 140 may be electrically separated (e.g., isolated) from the semiconductor chip 110. In some embodiments, the upper shielding layer 140 may include one of a conductive paste and a conductive adhesive.

The additional protection layer 145 may be provided on the upper shielding layer 140 to protect the upper shielding layer 140. The additional protection layer 145 may be formed to cover the whole top surface of the upper shielding layer 140. The additional protection layer 145 may be formed of or include an insulating material.

In some example embodiments, each of the lower and upper shielding layers 130 and 140 may have a multi-layered structure or single-layered structure, as shown in FIGS. 5A through 5C.

Figure 7:
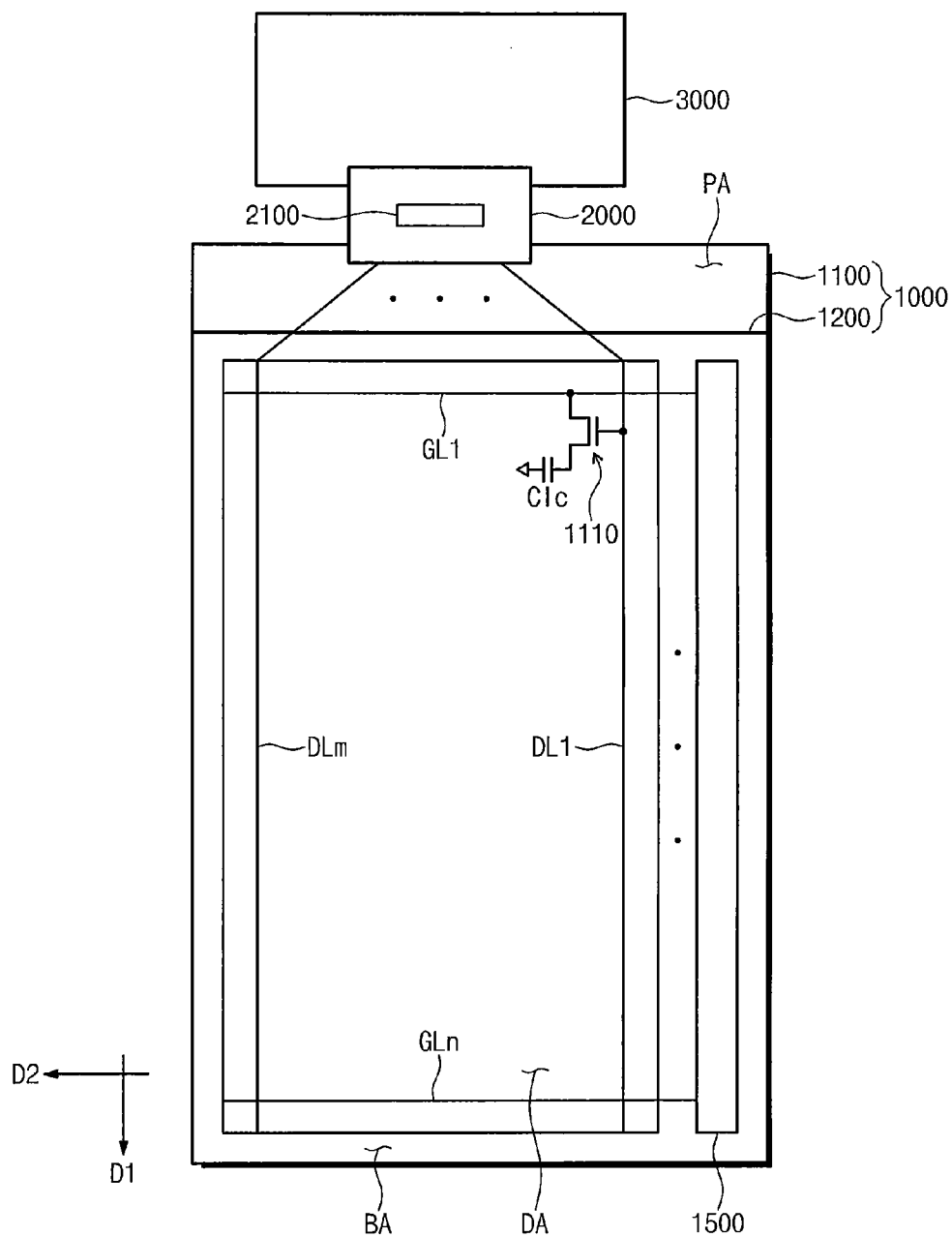
FIG. 7 is a plan view illustrating a liquid crystal display device, to which the semiconductor package according to example embodiments of the inventive concepts is provided.

FIG. 7 is a plan view illustrating a liquid crystal display device, to which the semiconductor package according to example embodiments of the inventive concepts is provided.

Referring to FIG. 7, a liquid crystal display device may include a liquid crystal display panel 1000 configured to display an image, a printed circuit board 3000 disposed adjacent to the liquid crystal display panel 1000, and a chip-on-film (COF) 2000 electrically connecting the liquid crystal display panel 1000 to the printed circuit board 3000.

The liquid crystal display panel 1000 may include an array substrate 1100, a color filter substrate 1200 facing the array substrate 1100, and a liquid crystal layer (not shown) interposed between the array substrate 1100 and the color filter substrate 1200. The array substrate 1100 may include a display region DA for displaying an image, a black matrix region BA disposed to enclose the display region DA, and a peripheral region PA adjacent to a side of the black matrix region BA.

On the display region DA of the array substrate 1100, a plurality of pixels may be provided to form a matrix-shaped arrangement. For example, a plurality of gate lines GL1-GLn and a plurality of data lines DL1-DLm may be provided on the display region DA. The plurality of data lines DL1-DLm may extend parallel to a first direction D1 and may be spaced apart from each other. The plurality of gate lines GL1-GLn may extend parallel to a second direction D2 or perpendicular to the first direction D1 and may be spaced apart from each other. The data lines DL1-DLm and the gate lines GL1-GLn may be disposed at different levels from each other, and this allows them to intersect each other, while maintaining the electrical separation (e.g., isolation) therebetween.

A plurality of pixel regions, which are arranged in a matrix shape by the gate lines GL1-GLn and the data lines DL1-DLm, may be defined on the display region DA. One pixel may be disposed on each pixel region, and each pixel may include a thin-film transistor 1110 and a liquid crystal capacitor Clc. The thin-film transistor 1110 may include, for example, a gate electrode connected to a corresponding one of the gate lines GL1, a source electrode connected to a corresponding one of the data lines DL1, and a drain electrode connected to a lower electrode of the liquid crystal capacitor Clc. A pixel electrode (not shown) serving as the lower electrode of the liquid crystal capacitor Clc may be provided on the array substrate 1100.

Although not illustrated in the drawings, the color filter substrate 1200 may include a color filter and a common electrode. The color filter may include red, green, and blue color pixels, the common electrode may be formed on the whole top surface of the color filter substrate 1200 to face the pixel electrode and constitute the liquid crystal capacitor Clc along with the pixel electrode. The common electrode may be applied with a common voltage (Vcom).

The liquid crystal display device may further include a gate driver 1500 and a data driver 2100. The gate driver 1500 may include a plurality of amorphous silicon transistors, which are directly formed on the array substrate 1100 using a thin-film process. The gate driver 1500 may be provided below the black matrix region BA adjacent to a long side of the liquid crystal display panel 1000 and may be connected to end portions of the gate lines GL1-GLn, respectively. The gate driver 1500 may sequentially apply gate signals to the plurality of gate lines GL1-GLn, to sequentially perform a scanning operation in a column unit of pixels, along the long side of the liquid crystal display panel 1000.

The data driver 2100 may be provided in the form of one-chip (hereinafter, a driver IC) and may be mounted on the COF 2000. The driver IC 2100 may be provided adjacent to a short side of the liquid crystal display panel 1000 and may be electrically connected to the plurality of data lines DL1-DLm to provide data signals to the plurality of data lines DL1-DLm. The COF 2000 may be configured to include a semiconductor package according to example embodiments of the inventive concepts.

The printed circuit board 3000 may be formed adjacent to the short side of the liquid crystal display panel 1000, and the printed circuit board 3000 may be electrically connected to the liquid crystal display panel 1000 through the COF 2000. For example, the COF 2000 may include a first end portion, which is attached to the peripheral region PA of the liquid crystal display panel 1000, and a second end portion, which is positioned opposite the first end portion and is attached to the printed circuit board 3000. Accordingly, signals to be output from the printed circuit board 3000 may be provided to the driver IC 2100 and/or the gate driver 1500 on the liquid crystal display panel 1000 through the COF 2000.

According to example embodiments of the inventive concepts, a lower shielding layer may be provided to wholly cover a bottom surface of a base film and consequently reduce or possibly prevent electro-magnetic interference (EMI). In some example embodiments, an upper shielding layer may be further provided to wholly cover a top surface of the base film and enhance the EMI prevention effect.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
   a base film comprising a top surface and a bottom surface;
   a circuit pattern disposed on the top surface of the base film and connected to a ground terminal;
   a via hole extending through the base film; and
   a lower shielding layer electrically connected to the circuit pattern, the lower shielding layer comprising a portion having a unitary structure that fills the via hole and extends on an entirety of the bottom surface of the base film.

2. The semiconductor package of claim 1, wherein the portion of the lower shielding layer comprises at least one of a conductive paste or a conductive adhesive.

3. The semiconductor package of claim 2, further comprising
   a lower protection layer on the lower shielding layer, wherein the lower shielding layer extends between the base film and the lower protection layer, and
   wherein the lower protection layer comprises an insulating material.

4. The semiconductor package of claim 2, wherein the conductive paste comprises a polymer and metal powder in the polymer, and
   wherein the conductive adhesive comprises a resin and metal particles in the resin.

5. The semiconductor package of claim 1, wherein the lower shielding layer comprises:
   a first lower layer having the unitary structure, filling the via hole and extending on the bottom surface of the base film; and
   a second lower layer on the first lower layer, wherein the second lower layer comprises a material different from the first lower layer, and the first lower layer is between the base film and the second lower layer.

6. The semiconductor package of claim 5, wherein the first lower layer comprises one of a conductive paste and a conductive adhesive, and the second lower layer comprises the same material as that comprising the circuit pattern.

7. The semiconductor package of claim 6, wherein the second lower layer comprises a metal layer including at least one of copper (Cu), silver (Ag), gold (Au), nickel (Ni), tin (Sn), zinc (Zn), chromium (Cr), manganese (Mn), indium (Id), palladium (Pd), titanium (Ti), molybdenum (Mo), or platinum (Pt).

8. The semiconductor package of claim 1, further comprising:

an upper shielding layer provided on the top surface of the base film and electrically connected to the circuit pattern, the upper shielding layer comprising an opening exposing the circuit pattern; and a semiconductor chip on the top surface of the base film and in the opening of the upper shielding layer.

9. The semiconductor package of claim 8, wherein the upper shielding layer comprises the same material as that comprising the lower shielding layer, and wherein the lower shielding layer and the upper shielding layer comprise a conductive paste or a conductive adhesive.

10. The semiconductor package of claim 8, wherein the upper shielding layer comprises:

a first upper layer electrically connected to the circuit pattern; and a second upper layer on the first upper layer to cover the first upper layer.

11. The semiconductor package of claim 1, further comprising:

an upper protection layer on the circuit pattern to protect the circuit pattern, the upper protection layer comprising a first opening and a second opening, and the first and second openings exposing the circuit pattern;

an upper shielding layer that is on the upper protection layer and is electrically connected to the circuit pattern through the first opening, the upper shielding layer comprising a third opening that overlaps the second opening of the upper protection layer in plan view; and a semiconductor chip on the top surface of the base film and in the second and third openings.

12. A semiconductor package, comprising:

a base film comprising a top surface and a bottom surface, the base film comprising a via hole that extends from the bottom surface of the base film toward the top surface of the base film;

an upper shielding layer extending on the top surface of the base film;

a circuit pattern that is between the top surface of the base film and the upper shielding layer and is electrically connected to a ground terminal; and a lower shielding layer comprising a portion having a unitary structure that fills the via hole and extends on an entirety of the bottom surface of the base film, wherein the lower shielding layer is electrically connected to the circuit pattern, and wherein the upper shielding layer is electrically connected to the circuit pattern.

13. The semiconductor package of claim 12, further comprising:

an upper protection layer between the circuit pattern and the upper shielding layer, wherein the upper protection layer comprises an insulating material and comprises an opening exposing the circuit pattern, wherein a portion of the upper shielding layer is in the opening of the upper protection layer and contacts the circuit pattern.

14. The semiconductor package of claim 12, further comprising a semiconductor chip disposed on the top surface of the base film, wherein the upper shielding layer comprises an opening, and wherein the semiconductor chip is in the opening of the upper shielding layer and is spaced apart from the upper shielding layer.

15. The semiconductor package of claim 14, further comprising an upper protection layer between the circuit pattern and the upper shielding layer, wherein the upper protection layer comprises an insulating material and comprises an opening that overlaps the opening of the upper shielding layer in plan view.

16. The semiconductor package of claim 12, further comprising a semiconductor chip between the top surface of the base film and the upper shielding layer.

17. The semiconductor package of claim 12, wherein the lower shielding layer comprises:

a first lower layer including a conductive paste or a conductive adhesive; and a second lower layer including copper (Cu), silver (Ag), gold (Au), nickel (Ni), tin (Sn), zinc (Zn), chromium (Cr), manganese (Mn), indium (Id), palladium (Pd), titanium (Ti), molybdenum (Mo), or platinum (Pt).

18. The semiconductor package of claim 17, wherein the conductive paste comprises a polymer and metal powder in the polymer, and wherein the conductive adhesive comprises a resin and metal particles in the resin.

19. The semiconductor package of claim 12, wherein the upper shielding layer comprises:

a first upper layer including a conductive paste or a conductive adhesive; and a second upper layer including copper (Cu), silver (Ag), gold (Au), nickel (Ni), tin (Sn), zinc (Zn), chromium (Cr), manganese (Mn), indium (Id), palladium (Pd), titanium (Ti), molybdenum (Mo), or platinum (Pt).

* * * * *